United States Patent [19]
Huang et al.

[11] Patent Number: 5,564,100
[45] Date of Patent: Oct. 8, 1996

[54] FREQUENCY MODULATOR HAVING A MODULATION VARACTOR COUPLED TO OUTPUT OF A VCO

[75] Inventors: Philip M. Huang; John K. McKinney, both of Sunrise, Fla.

[73] Assignee: Motorola, Inc., Schaumburg, Ill.

[21] Appl. No.: 432,377

[22] Filed: May 1, 1995

Related U.S. Application Data

[63] Continuation of Ser. No. 172,505, Dec. 22, 1993, abandoned, which is a continuation of Ser. No. 892,871, Jun. 3, 1992, abandoned.

[51] Int. Cl.[6] .................................................. H04B 1/26
[52] U.S. Cl. .................. 455/319; 455/197.2; 455/264; 455/333; 331/74; 331/177 V; 332/141
[58] Field of Search .......................... 455/318–20, 313, 455/118, 86, 197.2, 197.3, 208, 258, 262, 264, 75, 119; 331/74, 117 R, 177 V, 116 R, 116 FE, 117 FE; 332/141, 123

[56] References Cited

U.S. PATENT DOCUMENTS

| | | | |
|---|---|---|---|
| 4,458,215 | 7/1984 | Huang et al. | 331/177 V |
| 4,494,090 | 1/1985 | Popeck et al. | 331/177 V |
| 4,721,927 | 1/1988 | Aota et al. | 331/177 V |
| 5,160,902 | 11/1992 | Saeki et al. | 331/177 V |
| 5,258,997 | 11/1993 | Fraser | 455/75 |

Primary Examiner—Reinhard J. Eisenzopf
Assistant Examiner—Philip J. Sobutka
Attorney, Agent, or Firm—Robert S. Babayi; M. Mansour Ghomeshi

[57] ABSTRACT

A frequency modulator (100) is provided which includes a VCO (200) having a modulation varactor (122) coupled to its output (128). The VCO (200) includes a resonator stage (112) coupled to an amplifier stage comprising a transistor (118). Coupling of the varactor (122) and the resonator stage (112) is provided via the phase collector capacitance (Cμ) of the transistor (118).

10 Claims, 1 Drawing Sheet

FREQUENCY MODULATOR HAVING A MODULATION VARACTOR COUPLED TO OUTPUT OF A VCO

This is a continuation of application Ser. No. 08/172,505 filed Dec. 22, 1993 now abandoned, which is a continuation of Ser. No. 07/892,871, filed Jun. 3, 1993 and now abandoned.

BACKGROUND OF THE INVENTION

This invention relates to the field of frequency modulators and in particular to those modulators having a voltage controlled oscillator (VCO) for modulating a resonant frequency.

Frequency modulated (FM) signals are widely used in many communication devices, such as two-way portable and mobile radios, for communicating messages and other types of information. The FM signals are generated by varying the frequency of a carrier signal according to the variations of a modulation signal. The modulation signal may be an analog or a digital signal which is generated by a message transducer, such as a microphone, or a binary device, such as a microprocessor.

Generally, the modulation signal is applied to a frequency modulator which produces the FM signal. The FM signal may be processed in accordance with the requirements of a particular application to recover the modulation signal. For example, in a radio frequency (RF) transmitter application, the FM signal is amplified and transmitted through an antenna to other receiving devices which include means for recovering the modulation signal.

Many of the conventionally used frequency modulator circuits comprise voltage controlled oscillators. A VCO, which includes a feed back loop, provides a resonant frequency in response to a control voltage applied at a control port. Typically, a VCO circuit includes a varactor coupled to the control port and a resonator stage. The resonator stage is coupled to an amplifier stage, the output of which is fed back to the resonator stage so as to cause oscillation at the resonant frequency. As such, the resonant frequency of the VCO may be varied according to the variations of the control signal.

The VCO, when used as an FM modulator, is the modulation signal through a modulation port which is capacitively coupled to the resonator stage through a modulation varactor. Conventionally, the modulation signal may be coupled to the VCO in a number of different ways. In some applications, the modulation signal is applied directly to the control voltage port, thus, using the control voltage varactor as a modulation varactor as well. However, this approach makes the FM signal susceptible to variations on the control line and adversely affects the loop response of the VCO. These adversely affected parameters are manifested by an increase in side band noise or severe hum and noise degradations.

In another approach, the modulating signal is applied through a modulating port which includes an independent modulation varactor. The modulation varactor is coupled to the resonator stage by means of a capacitive coupling network. Thus, variations of the modulation signal varies the capacitance across the resonator, thereby providing a modulated signal which is amplified by the amplifier stage to produce the FM signal. However, the capacitive network of this approach causes the resonant frequency to suddenly shift to an undesired center frequency.

In yet another approach, the modulation signal is applied to the incoming supply line of the VCO through an interfacing circuit. However, this approach makes the FM signal susceptible to supply line variations.

Thus, conventional approaches for coupling the modulation signal to the VCO may adversely affect the resonator's quality factor (Q), and/or the loop filter response of the VCO, resonant frequency, and/or the side-band noise.

SUMMARY OF THE INVENTION

Briefly, a frequency modulator, according to the invention, includes a voltage controlled oscillator circuit having a modulation varactor coupled to its output for modulating the resonant frequency in response to a modulation signal. The VCO includes a resonator stage and an amplifier stage comprising an active device. The active device includes an output for providing a resonant frequency and means for capacitively coupling the modulation capacitor to the resonator stage.

DETAILED DESCRIPTION OF THE PREFERRED EMBODIMENTS

Figure 1:
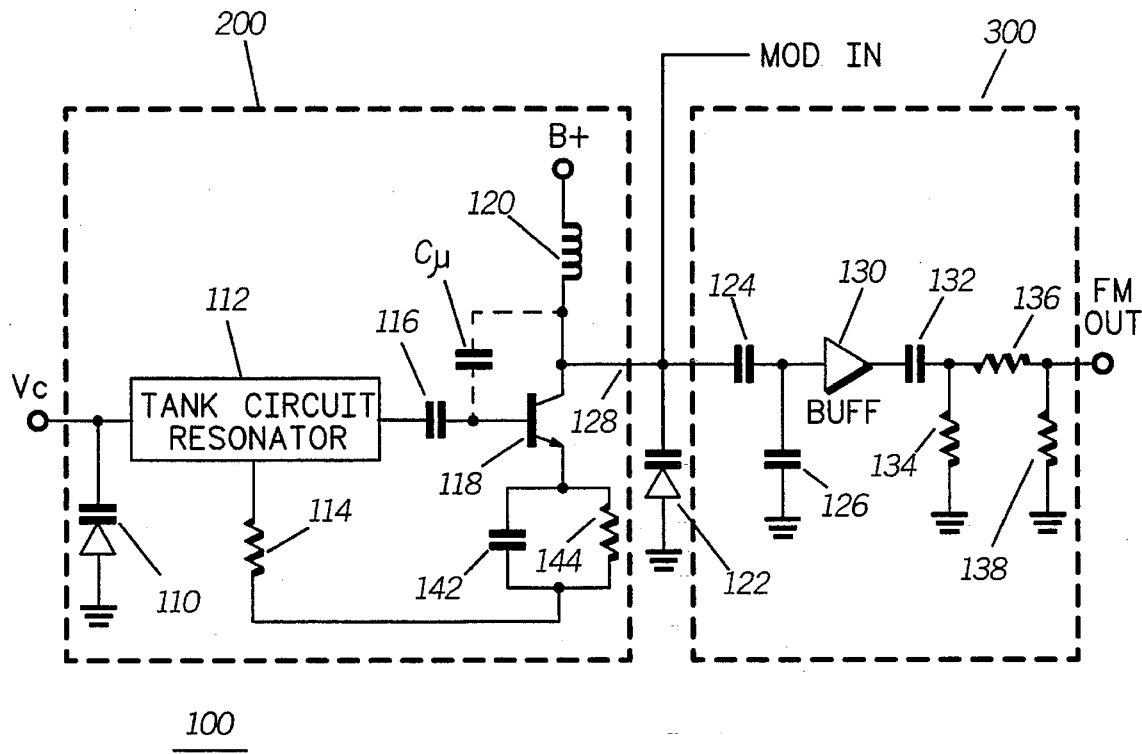
FIG. 1 is a schematic diagram of the frequency modulator according to the present invention.

Referring now by characters of reference to the drawings and first to FIG. 1, a frequency modulator 100, according to the present invention, includes a VCO circuit shown in a dotted block 200 having an output 128. The frequency modulator circuit 100 also includes a modulation varactor 122 and a buffer stage 300, both of which are coupled to the output 128. The VCO circuit 200 receives a control voltage Vc from an external source, such as a phase detector (not shown) in a phase locked loop circuit, to generate a resonant frequency at the output 128. The VCO circuit 200 includes a resonator stage comprising a varactor 110 and a tank circuit resonator, and an active amplifier stage comprising a transistor 118. The control voltage Vc is applied to the varactor 110 to affect capacitance variations across the tank circuit resonator 112 for tuning the VCO to a suitable resonant frequency. The tank circuit resonator 112 may comprise well-known transmission line structures such as microstrip or stripline structures. Alternatively, the tank circuit resonator 112 may comprise capacitive and/or inductive components arranged to form one of many well known resonator topologies as suited for a particular application. A coupling capacitor 116 is connected between the tank resonator circuit 112 and base of the transistor 118. In the preferred embodiment of the invention, the transistor 118 comprises a bipolar transistor which has a collector coupled to a bias voltage B+ through a DC coupling inductor 120. In order to complete the loop of the VCO circuit 200, the emitter of the transistor 128 is fed back to the tank circuit resonator through a resistor 114 and a network comprising a capacitor 142 and a resistor 144. The output 128 is taken from the collector of the transistor 118 and is connected to the modulation varactor 122 which is also biased by the biased voltage B+. The modulation varactor 122 receives a modulation signal MOD IN, the variations of which vary capacitance of the modulation varactor. As described later in detail, the modulation varactor 122 is capacitively coupled to the resonator stage of the VCO 200. Therefore, capacitance creates a modulated variation of the modulation varactor 122 signal at the output 128. The output 128 is also coupled to a buffer stage 300 which isolates the modulation varactor 122 from external circuitry. As such, the output 128 is coupled to a buffer circuit 130 through coupling capacitors 124 and 126, and the output of the buffered circuit 130 is passed thorough a coupling capacitor 132 and a resistive network comprising resistors 134, 136, and 138 to provide a modulated frequency output signal FM OUT.

According to the invention, the capacitive coupling between the varactor 122 and the tank circuit resonator 112 is provided through a small capacitance $C\mu$ provided by the base collector junction of the transistor 118. The capacitance $C\mu$ is characterized by the small signal model of a bipolar transistor as a very small capacitance existing between the collector base junction of the transistor 118. The applicants of the present invention have taken advantage of the collector base junction capacitance $C\mu$ to capacitively couple the modulation varactor 122 to the tank circuit resonator 112, while at the same time isolating the resonator stage from the modulation varactor 122 by means of an active device, namely, the transistor 118 of the amplifier stage. In this way, the capacitance $C\mu$ is utilized as an inherent coupling mechanism which provides for modulating the resonant frequency by the modulation varactor 122 as coupled to the VCO output without shifting the resonant frequency to an undesired center frequency. As stated, the disadvantages of the conventional approach which were caused by loading effects of the coupling capacitors on the resonator stage are avoided.

It may be appreciated that the bipolar transistor 118 of the amplifier stage may be replaced by any active devices as long as such active device provides capacitive coupling between its input terminal and its output terminal. An active device as described herein thus includes any semiconductor device exhibiting a nonlinear voltage-current characteristic. For example, the small signal model of a field effect transistor (FET) also includes a small capacitance existing between source and gate terminals. Accordingly, the frequency modulator 100 of the invention comprises a VCO circuit having a resonator stage which is coupled to an amplifier stage comprising an active device. The active device has a capacitive coupling means comprising the collector base capacitance $C\mu$ for coupling the modulation varactor 122 to the resonator stage.

Figure 2:
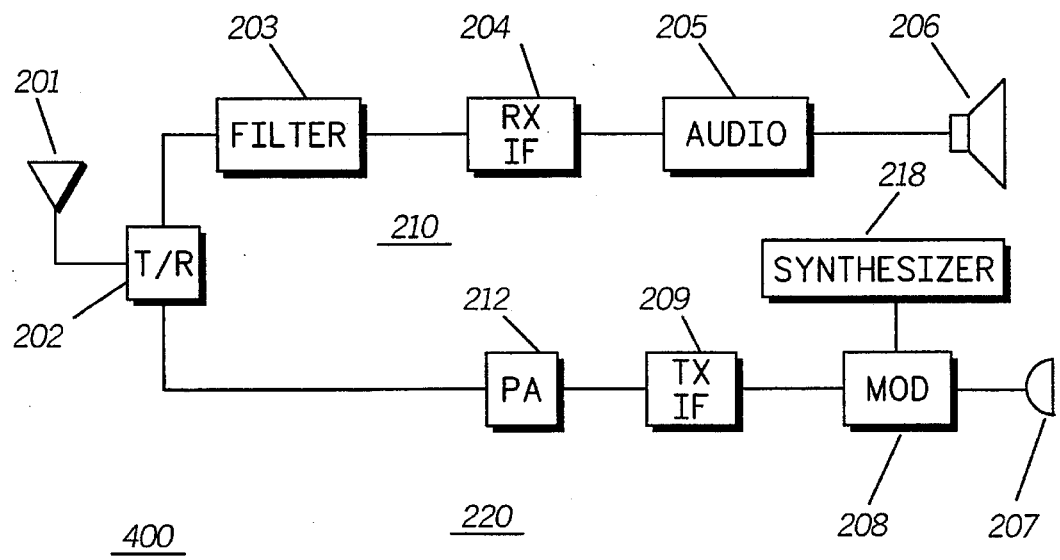
FIG. 2 is a block diagram of a radio which embodies the frequency modulator according to the present invention.

Referring to FIG. 2, an exemplary application of the frequency modulator of the present invention is shown as embodied in a radio 400. The general operation and the circuitry of the radio 400, except that of the frequency modulator of the present invention, are well known in the art. The radio 200 may comprise a portable two-way radio, such as those manufactured by Motorola Inc., which could operate in either the receive or transmit modes. The radio 400 includes a receiver section 210 and a transmitter section 220 which comprise means for communicating, that is, transmitting or receiving communication signals from and to the radio.

In the receive mode, the radio 400 receives a communication signal via an antenna 201. A transmit/receive (T/R) switch 202 couples the received communication signal to a filter 203 which provides the desired selectivity. The output of the filter 203 is applied to a well-known receiver IF section 204 which recovers the base band signal. The output of the receiver IF section is applied to a well-known audio section 205 which, among other things, amplifies audio messages and presents them to a speaker 206.

In the transmit mode, audio messages are input via a microphone 207, the output of which is applied to a frequency modulator 208. The frequency of modulator 208 which embodies the frequency modulator 100 of the present invention receives a control voltage from a synthesizer 218 to provide a FM output signal. The FM output signal is coupled to a well known transmitter IF section 209. A transmitter power amplifier 212 amplifies the output of the transmitter IF section 209 and applies it to the antenna 201 through the T/R switch 202 for transmission of the communication signal. It may be appreciated that the frequency modulator 100 of the present invention may be incorporated into the synthesizer 218 in combination with a well-known phase locked loop circuit to provide the receiver section 210's local oscillator frequency and the transmitter section 220's carrier frequency. In this way, the synthesizer 218 under the control of a microprocessor controller provides appropriate control voltage Vc for tuning the VCO to an appropriate resonant frequency suitable for operating in both the transmit and the receive modes.

As is apparent from the foregoing description, the present invention allows for coupling of a modulation varactor to the output of a VCO as long as the active stage of the VCO provides a capacitive coupling for effecting the capacitance across the resonator stage. As a result, the performance of the VCO is not degraded due to loading effects present in conventional designs. Thus, better side band noise performance and higher frequency stability are provided by the invention's frequency modulator. In addition, since the modulation port is isolated from the control port, the loop performance of the VCO is not susceptible to subtle variation on the modulation signal such as those caused by ambient noise.

We claim:

1. A frequency modulator, comprising:
    a voltage controlled oscillator (VCO) for providing an oscillator signal, including a resonator stage and an amplifier stage having an output for providing a resonant frequency, wherein said amplifier stage comprises an active device,
    the active device comprising:
        an input terminal;
        an output terminal;
        a reactance between the input and the output terminals;
        a variable capacitor means coupled to the output of the VCO; and
        a modulation input signal coupled to the output of the VCO solely without using any additional coupling components and through the reactance between the input and output terminals in order to eliminate the use of discrete coupling components and while simultaneously isolating the resonator stage from the variable capacitor means.

2. The frequency modulator of claim 1, wherein said variable capacitor means comprises a varactor.

3. The frequency modulator of claim 1, further including a buffer stage being coupled to said amplifier stage of the VCO.

4. The frequency modulator of claim 1, wherein said active device comprises a transistor device.

5. The frequency modulator of claim 4, wherein said transistor device comprises a bipolar transistor.

6. The frequency modulator of claim 5, wherein said inherent reactance comprises inherent capacitance of the base and collector junction of the bipolar transistor.

7. A voltage controlled oscillator (VCO) having an output coupled to a modulating signal, comprising:
    an output port;
    a resonator stage for generating an oscillator signal;

an amplifier stage, comprising:
  an input terminal;
  an output terminal coupled to the output of the VCO;
  a reactance between the input and the output terminals;
  a variable capacitor means coupled to the output of the VCO; and
  a modulation input signal coupled to the output port for coupling a modulating signal to the resonator stage without using any additional coupling components and solely through the reactance of the amplifier stage in order to eliminate the use of discrete coupling components and while simultaneously isolating the resonator stage from the variable capacitor means wherein the modulation input signal is used to modulate the oscillator signal.

8. The voltage controlled oscillator of claim 7, further including a buffer stage being coupled to said amplifier stage of the VCO.

9. The voltage controlled oscillator of claim 7, wherein the amplifier stage comprises a bipolar transistor having a base-collector junction.

10. The voltage controlled oscillator of claim 9, wherein said reactance comprises the inherent capacitance present at the base-collector.

* * * * *